(12) United States Patent
Kunishi et al.

(10) Patent No.: US 6,195,248 B1
(45) Date of Patent: Feb. 27, 2001

(54) ELECTRONIC COMPONENT HAVING A TIN ALLOY PLATING FILM

(75) Inventors: Tatsuo Kunishi, Omihachiman; Masanori Endo, Takefu; Yu Tokuda, Otsu; Yukiko Fujii, Kusatsu, all of (JP)

(73) Assignee: Murata Manufacturing Co., Ltd. (JP)

( * ) Notice: Under 35 U.S.C. 154(b), the term of this patent shall be extended for 0 days.

(21) Appl. No.: 09/206,599

(22) Filed: Dec. 7, 1998

(30) Foreign Application Priority Data

Dec. 24, 1997 (JP) .................................................. 9-355295

(51) Int. Cl.$^7$ ............................ H01G 4/12; H01G 4/008; H01G 4/06
(52) U.S. Cl. ................... 361/305; 361/321.2; 361/321.5
(58) Field of Search ..................................... 361/303, 305, 361/306.3, 308.1, 309–313, 320, 321.1–321.5; 29/25.42; 333/182–185; 338/20, 21

(56) References Cited

U.S. PATENT DOCUMENTS

| | | | |
|---|---|---|---|
| 4,618,912 | * 10/1986 | Sakabe et al. | 361/309 |
| 5,347,423 | * 9/1994 | deNeuf et al. | 361/313 |
| 5,426,560 | * 6/1995 | Amaya et al. | 361/309 |
| 5,852,542 | * 12/1998 | Wada et al. | 361/321.5 |
| 5,995,360 | * 11/1999 | Hata et al. | 361/321.5 |
| 6,008,981 | * 12/1999 | Harada et al. | 361/321.4 |

* cited by examiner

Primary Examiner—Anthony Dinkins
(74) Attorney, Agent, or Firm—Ostrolenk, Faber, Gerb & Soffen, LLP

(57) ABSTRACT

An electronic component has a body; a metal film formed on the body; and a tin alloy plating film formed on the metal film. The tin alloy plating film contains Sn and at least one additive metal selected from the group consisting of Bi, Ni, Ag, Zn and Co.

19 Claims, 1 Drawing Sheet

ELECTRONIC COMPONENT HAVING A TIN ALLOY PLATING FILM

BACKGROUND OF THE INVENTION

1. Field of the Invention

The present invention relates to an electronic component having a tin alloy plating film, and more particularly to an electronic component having a lead-free tin alloy plating film.

2. Description of the Related Art

Tin alloy plating films have been used in various electronic components. FIG. 1 shows a conventional laminated ceramic capacitor 5 as one example of such electronic components. The laminated ceramic capacitor 5 comprises a laminated ceramic body 3 in which dielectric layers 1 and internal electrodes 2 are alternately stacked and a pair of external electrodes 4 are electrically connected to the internal electrodes 2. Each of the external electrodes 4 includes a Ag electrode 4a as a foundation layer, a Ni electrode 4b provided on Ag electrode 4a as an intermediate layer and a Sn electrode or a Sn—Pb alloy electrode 4c provided on the Ni electrode 4b as an outermost layer.

The Ag electrode 4a is formed for electrical connection to an internal electrode, and the Ni electrode 4b is formed to prevent corroding of the Ag at the time of soldering or the generation of whiskers. The Sn electrode or Sn—Pb alloy electrode 4c is formed in order to promote the wettability of solder at the time of soldering.

The conventional electronic components represented by the laminated ceramic capacitor 5 have the following problems when the Sn electrode or Sn—Pb alloy electrode is formed. Sn plating films are likely to generate whiskers. On the other hand, the Sn—Pb alloy electrode includes Pb which is a regulated substance, and is therefore necessary to be replaced in view of environmental problems.

In addition, when the Sn or Sn—Pb alloy outermost electrode is formed by electrolytic plating the Ni electrode is usually formed in advance by electrolytic plating. However, the Ni plating liquid sometimes contaminates the Sn or Sn—Pb plating bath adversely. This results in degradation of the adhesive strength of the plating film and the poor quality of the obtained plating film.

In order to solve this problem, it is necessary to perform a cleaning process after the Ni plating process, thereby preventing residual Ni plating liquid from being brought into the plating bath of the Sn or Sn—Pb. In addition to this countermeasure, it might be necessary to renew the plating bath of Sn or Sn—Pb more frequently based on the number of uses of the plating bath. As a result, the number of process steps and production controls are increased. This results in an increase of the production cost.

For the forgoing reasons, there is a need for an electronic components having a plating film which includes no Pb, causes no whiskers and prevents corrosion of Ag at the time of soldering, as well as promotes wettability of solder.

SUMMARY OF THE INVENTION

The present invention is directed to an electronic component that satisfies the aforementioned need. The electronic component comprises: a body; a metal film formed on the body; and a tin alloy plating film formed on the metal film, where the tin alloy plating film comprises Sn and one or more additive metal selected from the group consisting of Bi, Ni, Ag, Zn and Co.

The metal film preferably comprises one of Ag and Cu. The content ratio of the additive metal is preferably within the range of about 0.5 to 20 wt %.

The additive metal may be Bi. In this case, the content ratio of Bi is preferably within the range of about 1 to 20 wt % and more preferably within the range of about 5 to 20 wt %.

The additive metal may be Ni. In this case, the content ratio of Ni is preferably within the range of about 0.5 to 10 wt %, and more preferably within the range of about 1 to 2 wt %.

The additive metal may be Ag. Here, the content ratio of Ag is preferably within the range of about 1 to 20 wt %, and more preferably within the range of about 5 to 10 wt %.

The additive metal may be Zn and the content ratio of Zn is preferably within the range of about 1 to 20 wt %, and more preferably within the range of about 5 to 8 wt %.

The additive metal may be Co. In this case, the content ratio of Co is preferably within the range of about 0.5 to 10 wt %, and more preferably within the range of about 1 to 2 wt %.

The body is preferably made of dielectric ceramic, piezoelectric ceramic, semiconductor ceramic, magnetic ceramic and insulating ceramic. The body may include a plurality of ceramic layers made of the selected material and a plurality of internal electrodes alternately stacked with each other and the metal film is electrically connected to the internal electrodes.

According to the present invention, there is provided an electronic component comprising a lead-free tin alloy plating film which prevents generation of whiskers and silver corrosion as well as maintaining a wettability in the solder of conventional Sn plating or Sn—Pb alloy plating. The lead-free tin alloy plating film further makes a Ni electrode interface layer unnecessary.

Therefore, no cleaning process is necessary before forming the tin alloy plating film, and the life time of the tin alloy plating bath also can be prolonged. Accordingly, the production cost of the electronic components can be reduced and the through put can be increased.

For the purpose of illustrating the invention, there is shown in the drawings several forms which are presently preferred, it being understood, however, that the invention is not limited to the precise arrangements and instrumentalities shown.

BRIEF DESCRIPTION THE DRAWINGS

DETAILED DESCRIPTION OF PREFERRED EMBODIMENTS

Hereinafter, the preferred embodiments of the present invention are explained in detail with reference to the drawings.

Although the present invention can be applied to various electronic components which are to be soldered, the preferred embodiments explained hereinafter refer to a laminated ceramic capacitor as one example of electronic components. For example, the present invention may be applied to thermistors, resistors, resonators, filters or the like having bodies made of dielectric ceramic, piezoelectric ceramic, semiconductor ceramic, magnetic ceramic and insulating ceramic. In addition, the present invention is suitably applied to chip type electronic components, but may be applied to other types of electronic components.

Figure 2:
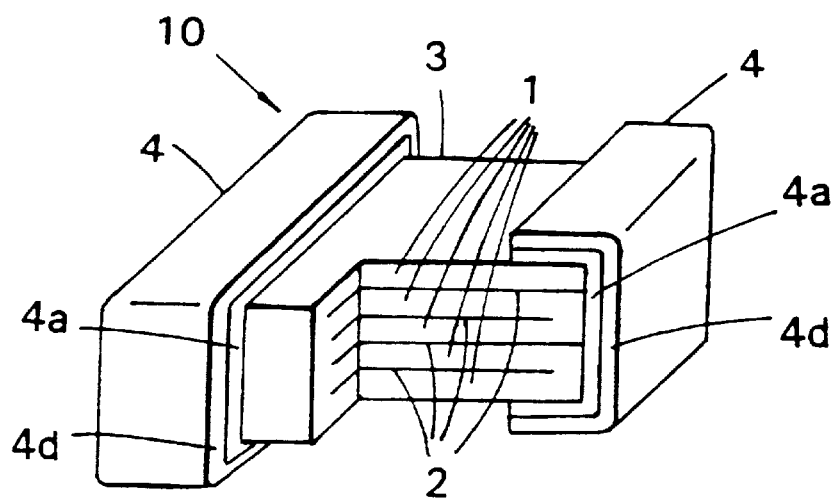
FIG. 2 is a partially notched perspective view showing a laminated ceramic capacitor according to an embodiment of the present invention.

FIG. 2 shows a laminated ceramic capacitor 10 according to an embodiment of the present invention. The laminated ceramic capacitor comprises a laminated ceramic body 3, a pair of foundation metal films 4a which comprise Ag and are provided on the laminated body 3 and a pair of tin alloy plating films 4d on the foundation metal films 4a. The foundation metal film 4a and the tin alloy plating film 4d constitute an external electrode 4. The laminated ceramic body 3 includes dielectric layers 1 and internal electrodes 2 alternately stacked with each other, and the internal electrodes 2 are alternately connected to the foundation metal films 4a provided on opposite sides, respectively, whereby internal electrodes 2 are electrically connected to the pair of external electrodes 4.

One of the important features of the laminated ceramic capacitor 10 is that the laminated ceramic capacitor 10 need not include a separate Ni electrode between the foundation metal film 4a and the tin alloy plating film 4d. This is attributed to the novel tin alloy plating film 4d which is free from lead and has an excellent silver corroding-resistance property and an whisker-resistance property as well as a wettability property. Since it is not necessary to form a Ni electrode before forming the tin alloy plating film 4d, there arises no contamination of the tin alloy plating bath. As a result, no cleaning process is necessary before forming the tin alloy plating film 4d. The life time of the tin alloy plating bath also can be prolonged. Accordingly, the production cost can be reduced and the through put can be increased.

Hereinafter, a production method of the laminated ceramic capacitor will be explained.

Figure 1:
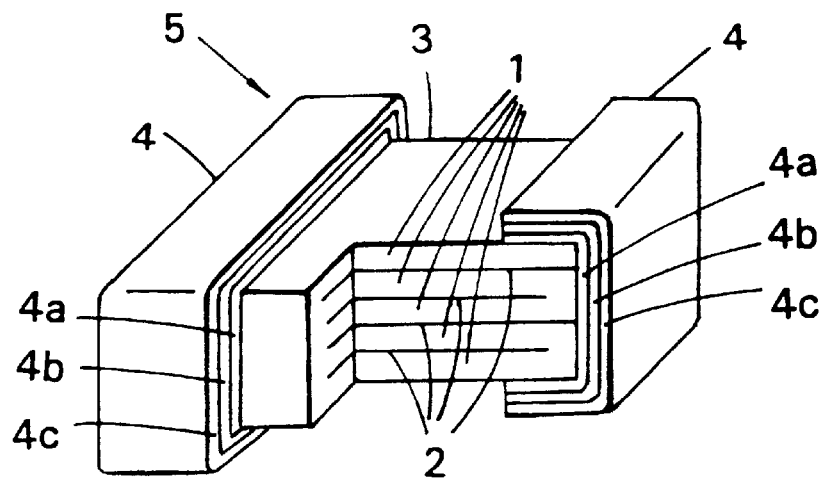
FIG. 1 is a partially notched perspective view showing a conventional laminated ceramic capacitor.

First, a laminated ceramic body 3 was prepared, as shown in FIG. 1. Specifically, ceramic green sheets which comprises a barium titanate as a main component were prepared. After a conductive paste for internal electrodes which comprises Ag—Pd alloy was screen-printed on the surfaces of the ceramic green sheets, a plurality of the ceramic green sheets were stacked and pressed onto each other to form a laminated body. The laminated body was then cut along the stacked direction into chips, each of which has cutting sections exposing the printed conductive pastes in the form of discrete layers. The chips are heated at 1300° C. for an hour, thereby obtaining laminated ceramic bodies.

A pair of external electrodes 4 which are electrically connected to the internal electrodes were formed on both end faces of the laminated ceramic body. The external electrode includes a baked Ag electrode as a foundation metal film 4a.

Subsequently, the plating baths shown in Table 1 were prepared. The current density and ratio of Sn and additive metal were determined for each plating bath so that the plating film obtained from each plating bath has a predetermined additive metal content by adjusting the tin-salt concentration in the Sn—Bi bath, Sn—Ni bath, Sn—Zn bath and Sn—Co bath, the silver-salt concentration in the Sn—Ag bath and the lead-salt concentration in Sn—Pb bath. Therefore, Sn metal alloy plating films 4d were formed on the Ag foundation metal layers 4a of the laminated ceramic capacitors 10 by using these plating baths. Consequently, laminated ceramic capacitors 10 including the Ag foundation metal film 4a and Sn alloy plating films 4d on the Ag foundation metal film 4a and denoted as Sample numbers 1 to 33 were obtained.

TABLE 1

| Examples | | |
|---|---|---|
| Sn—Bi alloy bath | Stannous sulfate | 0.05–0.10 mol/l |
| | Bismuth sulfate | 0.35 mol/l |
| | Sulfuric acid | 1.00 mol/l |
| | Gluconic acid | 0.25 mol/l |
| | Polyoxyethylenonyl phenyl ether | 5.00 g/l |
| | pH | ≦1.0 |
| | Bath temperature | 25° C. |
| | Current density | 0.25–1.00 A/dm$^2$ |
| Sn—Ni alloy bath | Stannous sulfate | 0.05–0.15 mol/l |
| | Nickel sulfate hexahydrate | 0.20 mol/l |
| | Potassium gluconate | 0.60 mol/l |
| | Aluminum sulfate | 0.06 mol/l |
| | Sulfathiazole | 8.00 g/l |
| | pH | 4.0 |
| | Bath temperature | 25° C. |
| | Current density | 1.00–2.00 A/dm$^2$ |
| Sn—Ag alloy bath | Stannous chloride | 0.20 mol/l |
| | Silver iodide | 20.–20.0 mol/l |
| | Potassium pyrophosphate | 0.50 mol/l |
| | Potassium iodide | 2.00 mol/l |
| | pH | 9.0 |
| | Bath temperature | 60° C. |
| | Current density | 0.25–1.00 A/dm$^2$ |
| Sn—Zn alloy bath | Stannous sulfate | 0.05–0.15 mol/l |
| | Zinc sulfate heptahydrate | 0.10 mol/l |
| | Sodium gluconate | 0.75 mol/l |
| | Peptone | 0.15 g/l |
| | pH | 7.0 |
| | Bath temperature | 60° C. |
| | Current density | 1.00–2.00 A/dm$^2$ |
| Sn—Co alloy bath | Stannous pyrophosphate | 0.05–0.20 mol/l |
| | Cobalt chloride | 0.02 mol/l |
| | Potassium pyrophosphate | 0.50 mol/l |
| | Diaminopropane | 3.0 mol/l |
| | Glycine | 10.0 g/l |
| | pH | 9.0 |
| | Bath temperature | 50° C. |
| | Current density | 0.25–1.00 A/dm$^2$ |
| Comparative Examples | | |
| Sn bath | Stannous sulfate | 0.15 mol/l |
| | Sodium citrate | 0.50 mol/l |
| | Ammonium sulfate | 1.00 mol/l |
| | Lauryldimethylbetaine | 1.00 g/l |
| | pH | 5.0 |
| | Bath temperature | 40.0° C. |
| | Current density | 0.25 A/dm$^2$ |
| Sn—Pb alloy bath | Stannous sulfate | 0.15 mol/l |
| | Lead acetate | 0.01/0.05 mol/l |
| | Sodium gluconate | 0.50 mol/l |
| | Polyoxyethlenelaurylamine | 1.00 g/l |
| | pH | 8.0 |
| | Bath temperature | 30.0° C. |
| | Current density | 0.25 A/dm$^2$ |

Subsequently, Samples 1 to 33 of the obtained ceramic capacitors were subjected to the following three tests. It is noted that the content ratio of additive metals in the Sn alloy plating films are limited to about 20 wt % or less as the Sn alloy plating film becomes brittle in the case the content ratios of the additive metals is greater than about 20 wt %.

In a test of wettability in solder, Samples 1 to 33 were immersed in a solder fusion tank for 2 seconds. Thereafter, the area covered by solder was measured for each sample. The solders used for this test were as follows:

1) Sn/Pb=60:40 Fusion temperature: 230° C. Flux type: non-halogen
2) Sn/Pb=60:40 Fusion temperature: 230° C. Flux type: halogen
3) Sn/Ag=96.5:3.5 Fusion temperature: 250° C. Flux type: non-halogen
4) Sn/Ag=96.5:3.5 Fusion temperature: 250° C. Flux type: halogen In a test of silver corroding-resistance, Samples 1 to 33 were immersed in a solder fusion tank at 270° C. for 30 seconds. Thereafter, the area in which Ag does not corrode by solder but has remained was measured. The solder used in this test was solder 1) mentioned above.

In a test of whiskers-resistance, Samples 1 to 33 were immersed in thermostat tank at 50° C. for 60 days. Thereafter, the center section excluding the peripheral area of 5 mm from the end of the plating area was observed by metallographical microscope.

Table 2 shows the test results obtained from Samples 1 to 33. In the test of wettability of solder, when the areas covered by solder are 85% or more and less than 90%, 90% or more and less than 95%, and 95% or more, the results are identified as fair, good and excellent and indicated by the letters "C", "B", and "A", respectively. There were no samples in which the area covered by solder is less than 85%.

In the test of silver corroding-resistance, when the areas in which Ag is not corroded by solder but has remained are 50% or more and less than 75%, 75% or more and less than 90%, and 90% or more, the results are identified as fair, good and excellent and indicated by the letters "C", "B", and "A", respectively. There were no samples in which the remained area is less than 75%.

In the test of whiskers-resistance, when the whiskers are generated in the same degree as those generated in a Sn plating film, the result was judged as poor and indicated by the letter "D". When the generation of whiskers is fewer than Sn plating film but the generation of whiskers was recognized, the result was judged as fair and indicated by the letter "C". When the generation of whiskers is hardly recognized, the result is judged as good and indicated by the letter "B". When no generation of whiskers was recognized, the result was judged as excellent and indicated by the letter "A".

For a comprehensive evaluation, the letters "A" and "B" mean excellent and good, respectively. The letter "C" means practically fair.

TABLE 2

| Sample No. | Alloy composition | Content (wt %) | Wettability Solder 1 | Wettability Solder 2 | Wettability Solder 3 | Wettability Solder 4 | silver corroding-resistance | whisker-resistance | comprehensive evaluation |
|---|---|---|---|---|---|---|---|---|---|
| 1 | Sn/Bi | Bi: 0.5 | A | A | A | A | C | C | C |
| 2 | | 1.00 | A | A | A | A | B | B | B |
| 3 | | 5.00 | A | A | A | A | A | A | A |
| 4 | | 10.0 | A | A | A | A | A | A | A |
| 5 | | 20.0 | A | A | A | A | A | A | A |
| 6 | Sn/Ni | Ni: 0.5 | A | A | A | A | B | C | B |
| 7 | | 1.00 | B | A | B | A | A | A | A |
| 8 | | 2.00 | B | A | B | A | A | A | A |
| 9 | | 3.00 | C | B | B | A | A | A | B |
| 10 | | 5.00 | C | B | C | B | A | A | B |
| 11 | | 10.0 | C | B | C | B | A | A | B |
| 12 | | 20.0 | C | C | C | C | A | A | C |
| 13 | Sn/Ag | Ag: 0.5 | A | A | A | A | C | C | C |
| 14 | | 1.00 | A | A | A | A | B | B | B |
| 15 | | 5.00 | A | A | A | A | A | A | A |
| 16 | | 10.0 | A | A | A | A | A | A | A |
| 17 | | 20.0 | C | A | C | A | A | A | B |
| 18 | Sn/Zn | Zn: 0.5 | A | A | A | A | C | C | C |
| 19 | | 1.00 | A | A | A | A | B | B | B |
| 20 | | 5.00 | B | A | B | A | A | A | A |
| 21 | | 8.00 | B | A | B | A | A | A | A |
| 22 | | 10.0 | C | A | C | A | A | A | B |
| 23 | | 20.0 | C | A | C | A | A | A | B |
| 24 | Sn/Co | Co: 0.5 | A | A | A | A | B | C | B |
| 25 | | 1.0 | B | A | B | A | A | A | A |
| 16 | | 2.0 | B | A | B | A | A | A | A |
| 27 | | 3.0 | C | B | B | A | A | A | B |
| 28 | | 5.0 | C | B | C | B | A | A | B |
| 29 | | 10.0 | C | B | C | B | A | A | B |
| 30 | | 20.0 | C | C | C | C | A | A | C |
| 31 | Sn | Sn: 100.0 | A | A | A | A | C | C | C |
| 32 | Sn/Pb | Pb: 10.0 | A | A | A | A | C | A | B |
| 33 | | 40.0 | A | A | A | A | C | A | B |

In the test for wettability of solder, the Sn—Bi alloy plating films and the Sn—Ag alloy plating films show good results regardless of the content ratio of Bi or Ag and the kinds of solder or flux. However, the Sn—Ag alloy plating film containing Ag at about 20 wt % shows fair wettability to the non-halogen type flux. The Sn—Bi alloy plating films tend to be brittle as the Bi content increases.

The Sn—Ni alloy plating film and the Sn—Co alloy plating film show a tendency to decrease in wettability with increasing content of Ni or Co and have fair wettability to the non-halogen type flux at 5 wt % content. When the content exceeded 10 wt %, the Sn—Ni alloy plating film and the Sn—Co alloy plating film show fair wettability against even the halogen type flux.

The Sn—Zn alloy plating films show a tendency to decrease in wettability with increasing content of Zn and have a fair wettability to the non-halogen type flux at 10 wt % content.

In the test for silver corroding-resistance, the Sn—Bi alloy, Sn—Ag alloy and Sn—Zn alloy plating films do not show practically any silver corroding-resistance at a content ratio of 0.5 wt %, but exhibit good resistance at the content ratio of 1 wt %. The silver corroding-resistance becomes remarkable at the content ratio of 5 wt % or more.

The Sn—Ni alloy and Sn—Co alloy plating films show good silver corroding-resistance at the content ratio of 0.5 wt % and the silver corroding-resistance becomes remarkable at the content ratio of 1 wt % or more.

In the test for whisker-resistance, the Sn—Bi alloy Sn—Ag alloy, and Sn—Zn alloy plating films do not show practical whisker-resistance at a content ratio of 0.5 wt %, but exhibit good resistance at a content ratio of 1 wt %. The whisker-resistance becomes remarkable at the content ratio of 5 wt % or more.

The Sn—Ni alloy and Sn—Co alloy plating films shows no generation of whiskers at a content ratio of 1 wt %.

In view of the aforementioned test results, a preferable composition for each Sn alloy plating film is found as follows.

First, it is generally preferable that the content ratio of Bi, Ni, Ag, Zn or Co in the Sn alloy plating films according to the present invention is within the range of about 0.5 wt % to 20 wt % in view of the results of the silver corroding-resistance test and the whiskers-resistance test.

More specifically, it is preferable that the content ratio of Bi in the Sn—Bi alloy plating film is within the range of about 0.5 wt % to 20 wt % with respect to 100 wt % of Sn—Bi alloy plating film. The content ratio is more preferably within the range of about 1 wt % to 20 wt % and further preferably within the range of about 5 wt % to 20 wt %.

It is preferable that the content ratio of Ni in the Sn—Ni alloy plating film is within the range of about 0.5 wt % to 20 wt % with respect to 100 wt % of Sn—Ni alloy plating film. The content ratio is more preferably within the range of about 0.5 wt % to 10 wt % and further preferably within the range of about 1 wt % to 2 wt %.

It is preferable that the content ratio of Ag in the Sn—Ag alloy plating film is within the range of about 0.5 wt % to 20 wt % with respect to 100 wt % of Sn—Ag alloy plating film. The content ratio is more preferably within the range of about 1 wt % to 20 wt % and further preferably within the range of about 5 wt % to 10 wt %.

It is preferable that the content ratio of Zn in the Sn—Zn alloy plating film is within the range of about 0.5 wt % to 20 wt % with respect to 100 wt % of Sn—Zn alloy plating film. The content ratio is more preferably within the range of about 1 wt % to 20 wt % and further preferably within the range of about 5 wt % to 8 wt %.

It is preferable that the content ratio of Co in the Sn—Co alloy plating film is within the range of about 0.5 wt % to 20 wt % with respect to 100 wt % of Sn—Co alloy plating film. The content ratio is more preferably within the range of about 0.5 wt % to 10 wt % and further preferably within the range of about 1 wt % to 2 wt %.

It has confirmed by the inventors of the present invention that the same plating characteristics as those explained above are obtained form the plating baths in which other reagents comprising Sn, Bi, Ni, Ag, Zo or Co and other additive reagents than those used in the above-explained embodiments are contained. Therefore, a plating bath having a composition other than those in the embodiments exemplified may be used as long as the plating bath gives the Sn alloy plating films having the aforementioned content ratios.

Although in the aforementioned embodiments, the Sn alloy plating films are formed on baked Ag electrode, the Sn alloy plating films may be formed on baked Cu electrodes. In this case, the Sn alloy plating films also shows the excellent wettability to solder and the whiskers-resistance.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An electronic component comprising:
   a body;
   a metal film on the body; and
   a tin alloy plating film on the metal film, the tin alloy plating film comprising Sn and at least one additive metal selected from the group consisting of Bi, Ni, Ag, Zn and Co.

2. The electronic component according to claim 1, wherein the metal film comprises Ag or Cu or both and wherein there is no Ni containing layer disposed between the metal film and tin alloy plating film.

3. The electronic component according to claim 2, wherein the content ratio of the additive metal is within the range of about 0.5 to 20 wt %.

4. The electronic component according to claim 3, wherein the additive metal is Bi, and the content ratio of Bi is within the range of about 1 to 20 wt %.

5. The electronic component according to claim 4, wherein the content ratio of Bi is within the range of about 5 to 20 wt %.

6. The electronic component according to claim 3, wherein the additive metal is Ni, and the content ratio of Ni is within the range of about 0.5 to 10 wt %.

7. The electronic component according to claim 6, wherein the content ratio of Ni is within the range of about 1 to 2 wt %.

8. The electronic component according to claim 3, wherein the additive metal is Ag, and the content ratio of Ag is within the range of about 1 to 20 wt %.

9. The electronic component according to claim 8, wherein the content ratio of Ag is within the range of 5 to 10 wt %.

10. The electronic component according to claim 3, wherein the additive metal is Zn and the content ratio of Zn is within the range of about 1 to 20 wt %.

11. The electronic component according to claim 10, wherein the content ratio of Zn is within the range of about 5 to 8 wt %.

12. The electronic component according to claim 3, wherein the additive metal is Co and the content ratio of Co is within the range of about 0.5 to 10 wt %.

13. The electronic component according to claim 12, wherein the content ratio of Co is within the range of about 1 to 2 wt %.

14. The electronic component according to claim 1, wherein the body is selected from the group consisting of dielectric ceramic, piezoelectric ceramic, semiconductor ceramic, magnetic ceramic and insulating ceramic.

15. The electronic component according to claim 14, wherein the body comprises a plurality of ceramic layers and a plurality of internal electrodes each of which is disposed between adjacent ceramic layers and the metal film is electrically connected to at least two of the internal electrodes.

16. The electronic component according to claim 15 having a second said metal film and a second said tin alloy plating film on the second said metal film.

17. The electronic component according to claim 16 wherein the second metal film is electrically connected to at least two internal electrodes to which the first metal film is not electrically connected.

18. The electronic component according to claim 17 wherein at least one internal electrode electrically connected to one of the first and second metal films is disposed between two internal electrodes electrically connected to the other of the first and second metal films.

19. The electronic component according to claim 1 having a second said metal film and a second said tin alloy plating film on the second said metal film.

* * * * *